United States Patent
Miyata (10) Patent No.: US 9,444,220 B2
(45) Date of Patent: Sep. 13, 2016

(54) METHOD FOR CONTROLLING WAVELENGTH TUNABLE LASER

(71) Applicant: Sumitomo Electric Device Innovations, Inc., Yokohama-shi (JP)

(72) Inventor: Mitsuyoshi Miyata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/579,833

(22) Filed: Dec. 22, 2014

(65) Prior Publication Data

US 2015/0188284 A1 Jul. 2, 2015

(30) Foreign Application Priority Data

Dec. 27, 2013 (JP) ................................. 2013-271615

(51) Int. Cl.
| | |
|---|---|
| *H01S 3/10* | (2006.01) |
| *H01S 5/0687* | (2006.01) |
| *H01S 5/0625* | (2006.01) |
| *H01S 5/024* | (2006.01) |
| *H01S 5/026* | (2006.01) |
| *H01S 5/06* | (2006.01) |
| *H01S 5/12* | (2006.01) |

(52) U.S. Cl.
CPC ......... *H01S 5/0687* (2013.01); *H01S 5/06256* (2013.01); *H01S 5/0265* (2013.01); *H01S 5/02415* (2013.01); *H01S 5/0617* (2013.01); *H01S 5/06258* (2013.01); *H01S 5/1209* (2013.01); *H01S 5/1212* (2013.01)

(58) Field of Classification Search
CPC .... H01S 5/0687; H01S 5/0265; H01S 5/028; H01S 5/0612; H01S 5/06256; H01S 5/1212; H01S 5/0683; H01S 5/1209; H01S 5/141; H01S 5/34306; H01S 5/06258
See application file for complete search history.

(56) References Cited

U.S. PATENT DOCUMENTS

| | | | | |
|---|---|---|---|---|
| 2002/0136249 | A1* | 9/2002 | Akashi et al. | 372/29.02 |
| 2002/0186729 | A1* | 12/2002 | Nasu et al. | 372/34 |
| 2003/0002050 | A1* | 1/2003 | Tatsuno et al. | 356/519 |
| 2005/0190803 | A1* | 9/2005 | Gronbach | H01S 5/0687 372/29.02 |
| 2009/0022186 | A1* | 1/2009 | Tanaka et al. | H01S 5/0612 372/20 |
| 2009/0251684 | A1* | 10/2009 | Arai et al. | 356/43 |

FOREIGN PATENT DOCUMENTS

JP 2009-026996 A 2/2009

* cited by examiner

*Primary Examiner* — Yuanda Zhang
(74) *Attorney, Agent, or Firm* — Venable LLP; Michael A. Sartori; Trent B. Ostler (57) ABSTRACT

A method for controlling wavelength tunable laser comprises the steps of inputting information specifying a first wavelength, determining whether or not the first wavelength is identical to a second wavelength coinciding with any of the fundamental wavelengths stored in the first memory, acquiring a drive condition for the second wavelength from the first memory when it is determined that the first and second wavelengths are identical to each other, calculating a drive condition at the first wavelength, when it is determined that the first and second wavelengths differ from each other, by acquiring the drive condition for the second wavelength from the first memory and using the drive condition according to the difference between the first and second wavelengths, and controlling an lasing wavelength of the wavelength tunable laser according to the drive condition in the acquiring step or calculating step.

11 Claims, 10 Drawing Sheets

| Ch | Initial set values ||||||| Feedback control target values ||
|---|---|---|---|---|---|---|---|---|---|
| | $I_{LD}$ [mA] | $I_{SOA}$ [mA] | $T_{LD}$ [degC] | $T_{Etalon}$ [degC] | $P_{heater1}$ [mW] | $P_{heater2}$ [mW] | $P_{heater3}$ [mW] | $I_{m1}$ [μA] | $I_{m2}/I_{m1}$ A.U. |
| 1 | 150.00 | 67.39 | 52.508 | 50.000 | 29.42 | 57.47 | 50.69 | 315.0 | 1.175 |
| 2 | 150.00 | 47.74 | 34.533 | 50.000 | 64.38 | 81.31 | 72.45 | 317.5 | 1.518 |
| 3 | 150.00 | 50.86 | 38.727 | 50.000 | 59.05 | 77.71 | 69.12 | 313.0 | 1.229 |
| ... | ... | ... | ... | ... | ... | ... | ... | ... | ... |
| n | 150.00 | 54.77 | 54.046 | 50.000 | 41.24 | 43.32 | 11.69 | 317.2 | 1.441 |

Fig.4

| Temperature correction coefficient |
|---|
| C1 [GHz/°C] |
| 0.7 |

METHOD FOR CONTROLLING WAVELENGTH TUNABLE LASER

TECHNICAL FIELD

The present invention relates to a method for controlling a wavelength tunable laser.

BACKGROUND

Wavelength tunable lasers whose output wavelengths are selectable have been disclosed (see, for example, Patent Literature 1). The technique of Patent Literature 1 stores a control condition for attaining grid wavelengths specified by the ITU-T (International Telecommunication Union Telecommunication Standardization Sector) into a memory and performs control for lasing at any of the grid wavelengths according to thus stored control condition.

Patent Literature 1: Japanese Patent Application Laid-Open Publication No. 2009-026996

SUMMARY

In gridless control which enables lasing at a wavelength other than grid wavelengths, the wavelength other than the grid wavelengths is required as a required wavelength. In this case, a drive condition at the wavelength other than the grid wavelengths is calculated according to a drive condition at a grid wavelength. However, unnecessary processing will occur if processing for calculating a drive condition is performed also when the required wavelength coincides with the grid wavelength.

It is therefore an object of the present invention to provide a method for controlling a wavelength tunable laser, which can prevent unnecessary processing from occurring.

One aspect of the present invention is a method for controlling a wavelength tunable laser having a first memory that stores a drive condition corresponding to a fundamental wavelength, comprising the steps of acquiring information for specifying a first wavelength to be lasing the laser; determining whether the first wavelength is identical to a second wavelength, the second wavelength being identical to the fundamental wavelength; acquiring a drive condition corresponding to the second wavelength stored in a memory, when it is determined that the first wavelength and the second wavelength are identical; calculating a drive condition based on a drive condition corresponding to the second wavelength stored in the memory, and value of wavelength difference between the first wavelength and the second wavelength, when it is determined that the first wavelength and the second wavelength are not identical; and controlling the wavelength tunable laser using the drive condition obtained by the acquiring step or the calculating step.

This aspect of the present invention can prevent unnecessary processing from occurring, for example.

DETAILED DESCRIPTION

Explanation of Embodiments of Present Invention

First, contents of embodiments of the present invention will be listed and explained. (1) A method for controlling a wavelength tunable laser having a first memory that stores a drive condition corresponding to a fundamental wavelength, may comprise the steps of: acquiring in formation for specifying a first wavelength to be lasing the laser; determining whether the first wavelength is identical to a second wavelength, the second wavelength being identical to the fundamental wavelength; acquiring a drive condition corresponding to the second wavelength stored in a memory, when it is determined that the first wavelength and the second wavelength are identical; calculating a drive condition based on a drive condition corresponding to the second wavelength stored in the memory, and value of wavelength difference between the first wavelength and the second wavelength, when it is determined that the first wavelength and the second wavelength are not identical; and controlling the wavelength tunable laser using the drive condition obtained by the acquiring step or the calculating step. (2) The wavelength tunable laser may have a wavelength detection unit using an etalon, and the drive condition includes a target value of the wavelength detection unit corresponding to the fundamental wavelength, and a control value of temperature of the etalon; and the calculating step may perform to calculate the control value of temperature of the etalon so that the first wavelength is achieved from the laser when the wavelength detection unit detects the target value corresponding to the second wavelength. (3) The information for specifying the first wavelength may contain at least two from among the parameters including wavelength or frequency corresponding to the wavelength to be referenced to a wavelength grid, a grid spacing of the wavelength grid, and a channel number of the wavelength grid. (4) The second wavelength may be any of wavelengths of ITU-T grids. (5) A second memory for storing data linking the drive condition of the first memory with a wavelength value may further be provided, the information specifying the first wavelength may be a wavelength value, and the drive condition at the second wavelength in the first memory may be acquired by referring to the second memory. (6) The wavelength detection unit may comprise a first light-receiving element for detecting light incident on the etalon and a second light-receiving element for detecting light emitted from the etalon; and auto power control (APC) of a light intensity of the wavelength tunable laser may be performed according to a detection result of the first light-receiving element. (7) The wavelength tunable laser may comprise an optical semiconductor amplifier; and a control signal of the auto power control may be fed to an electrode of the optical semiconductor amplifier. (8) The wavelength tunable laser may be mounted on a thermoelectric cooler (TEC); and the thermoelectric cooler may be feedback-controlled so that a front-to-back ratio of the etalon attains a target value. (9) A wavelength lock flag may be outputted when the front-to-back ratio of the etalon is seen to fall within a predetermined range of the target value. (10) When the temperature of the thermoelectric cooler may be seen to fall in a set temperature range, the feedback control of the thermoelectric cooler may be terminated, and feedback control of the thermoelectric cooler may be started so that the front-to-back ratio of the etalon attains the target value. (11) The etalon may be mounted on a thermoelectric cooler different from the former thermoelectric cooler, and the thermoelectric cooler may be feedback-controlled so that the temperature of the etalon falls within a predetermined range of a set value.

Details of Embodiments of Present Invention

In the following, specific examples of the method for controlling wavelength tunable laser in accordance with an embodiment of the present invention will be explained with reference to the drawings. However, the present invention is not limited to these illustrations, but is indicated by the claims and intends to include all the modifications within the meaning and scope equivalent to the claims.

Example 1

Figure 1:
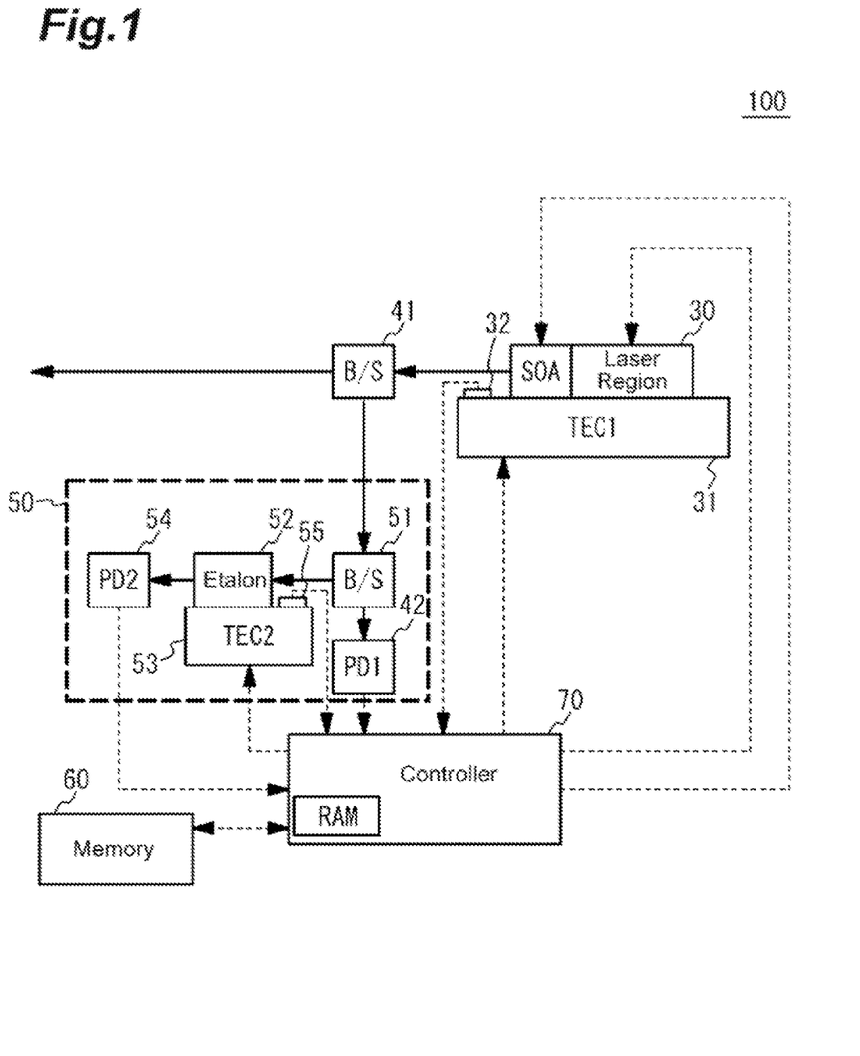
FIG. 1 is a block diagram illustrating the overall structure of the wavelength tunable laser in accordance with Example 1.

FIG. 1 is a block diagram illustrating the overall structure of a wavelength tunable laser 100 in accordance with Example 1. As illustrated in FIG. 1, the wavelength tunable laser 100 comprises a semiconductor laser 30 (tunable semiconductor laser), whose wavelength is controllable, as its laser device. The semiconductor laser 30 of this example is provided with a region which connects with a laser region and serves as an SOA (Semiconductor Optical Amplifier). This SOA functions as an optical output control unit. The SOA can freely increase and decrease the intensity of optical output. It can also control the optical output so that the intensity becomes substantially zero. The wavelength tunable laser 100 further comprises a detection unit 50, a memory 60, a controller 70, and the like. The detection unit 50 functions as an output detection unit and a wavelength locker unit. The controller 70 controls the wavelength tunable laser 100 and is equipped with a RAM (Random Access Memory) therewithin.

Figure 2:
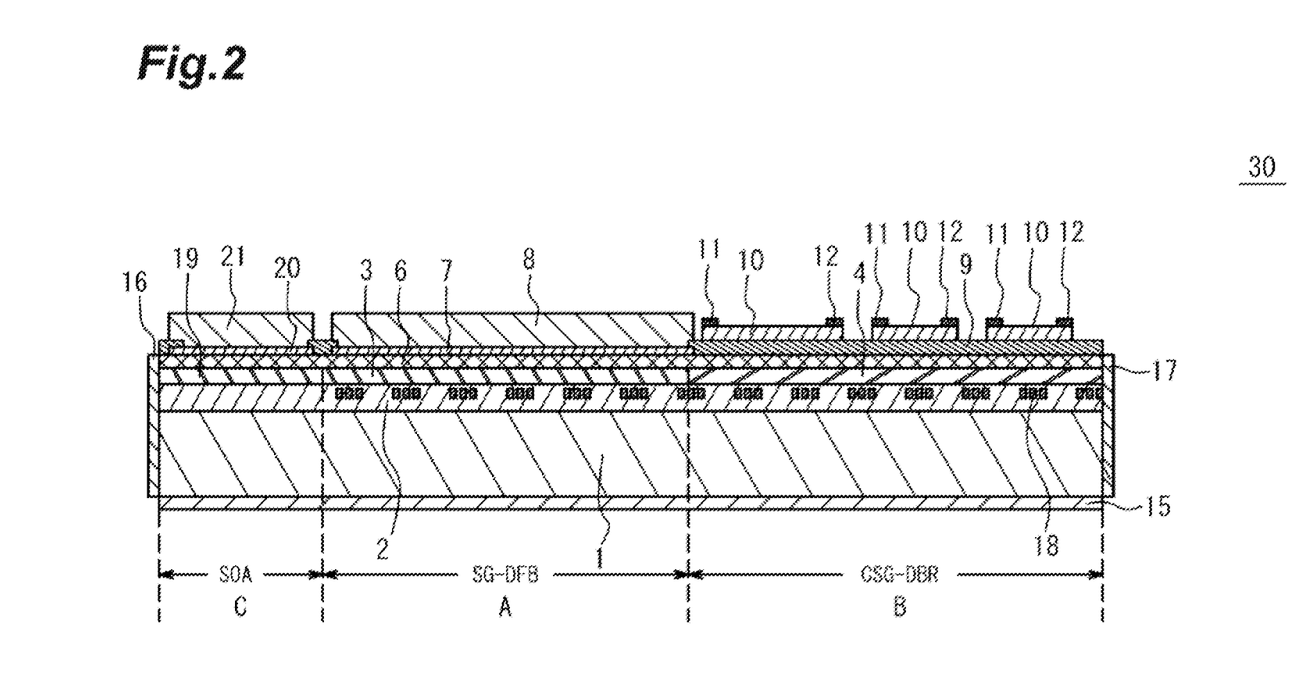
FIG. 2 is a schematic sectional view illustrating the overall structure of a semiconductor laser in this example.

FIG. 2 is a schematic sectional view illustrating the overall structure of the semiconductor laser 30 in this example. As illustrated in FIG. 2, the semiconductor laser 30 comprises an SG-DFB (Sampled Grating Distributed Feedback) region A, a CSG-DBR (Chirped Sampled Grating Distributed Bragg Reflector) region B, and an SOA (Semiconductor Optical Amplifier) region C. That is, the semiconductor laser 30 is a laser having a wavelength-selective mirror within a semiconductor structure.

By way of example, the SOA region C, SG-DFB region A, and CSG-DBR region B are arranged in this order from the front side to the rear side in the semiconductor laser 30. The SG-DFB region A, has a gain and is equipped with sampled gratings. The CSG-DBR region B has no gain but is equipped with sampled gratings. The SG-DFB region A and CSG-DBR region B correspond to the laser region in FIG. 1, while the SOA region C corresponds to the SOA region in FIG. 2.

The SG-DFB region A has a structure in which a lower cladding layer 2, an active layer 3, an upper cladding layer 6, a contact layer 7, and an electrode 8 are stacked on a substrate 1. The CSG-DBR region B has a structure in which the lower cladding layer 2, an optical waveguide layer 4, the upper cladding layer 6, an insulating film 9, and a plurality of heaters 10 are stacked on the substrate 1. Each heater 10 is provided, with a power electrode 11 and a ground electrode 12. The SOA region C has a structure in which the lower cladding layer 2, an optical amplification layer 19, the upper cladding layer 6, a contact layer 20, and an electrode 21 are stacked on the substrate 1.

The substrate 1, lower cladding layer 2, and upper cladding layer 6 are formed integrally in the SG-DFB region A, CSG-DBR region B, and SOA region C. The active layer 3, optical waveguide layer 4, and optical amplification layer 19 are formed on the same plane. The boundary between the SG-DFB region A and CSG-DBR region B corresponds to the boundary between the active layer 3 and optical waveguide layer 4.

An end face film 16 is formed at end faces of the substrate 1, lower cladding layer 2, optical amplification layer 19, and upper cladding layer 6 on the SOA region C side. The end face film 16 is an AR (Anti Reflection) film in this example. The end face film 16 functions as a front-side end face of the semiconductor laser 30. An end face film 17 is formed at end faces of the substrate 1, lower cladding layer 2, optical waveguide layer 4, and upper cladding layer 6 on the CSG-DBR region B side. The end face film 17 is an AR film in this example. The end face film 17 functions as a rear-side end face of the semiconductor laser 30.

The substrate 1 is a crystal substrate made of n-type LIP, for example. The lower cladding layer 2 and upper cladding layer 6, which are of n and p types, respectively, are composed of InP, for example. The lower cladding layer 2 and upper cladding layer 6 optically confine the active layer 3, optical waveguide layer 4, and optical amplification layer 19 from the lower and upper sides.

The active layer 3 is composed of a semiconductor having a gain. For example, the active layer 3 has a quantum well structure in which well layers made of $Ga_{0.32}In_{0.68}As_{0.92}P_{0.08}$ (each having a thickness of 5 urn) and harrier layers made of $Ga_{0.22}In_{0.78}As_{0.47}P_{0.53}$ (each having a thickness of 10 nm), for instance, are stacked alternately. For example, the optical waveguide layer 4 can be constructed by a bulk semiconductor layer, which is composed of $Ga_{0.22}In_{0.78}As_{0.47}P_{0.53}$, for instance. The optical waveguide layer 4 has an energy gap greater than that of the active layer 3 in this example.

The optical amplification layer 19 is a region which achieves optical amplification according to a gain imparted by a current injected from the electrode 21. For example, the optical amplification layer 19 can be constructed by a quantum well structure in which well layers made of $Ga_{0.35}In_{0.65}As_{0.99}P_{0.01}$ (each having a thickness of 5 nm) and barrier layers made of $Ga_{0.15}In_{0.85}As_{0.32}P_{0.68}$ (each having a thickness of 10 nm), for instance, are stacked alternately. A bulk semiconductor composed of $G_{0.44}In_{0.56}As_{0.95}P_{0.05}$, for example, can be employed as another structure. The optical amplification layer 19 and active layer 3 can also be composed of the same material.

The contact layers 7, 20 can be constructed by a p-type $Ga_{0.47}In_{0.53}As$ crystal, for example. The insulating film 9 is a protective film composed of a silicon nitride film (SiN) or a silicon oxide film NO). The heaters 10 are thin-film resistors composed of titanium tungsten (TiW). Each of the heaters 10 may be formed over a plurality of segments of the CSG-DBR region B.

The electrodes 8, 21, power electrode 11, and grand electrode 12 are composed of an electroconductive material such as gold (Au). A backside electrode 15 is formed under the substrate 1. The backside electrode 15 is formed over the SG-DFB region A, CSG-DBR region B, and SOA region C.

The end face films 16, 17, each of which is an AR film exhibiting a reflectance of 1.0% or less, have such a characteristic that their corresponding end faces are substantially non-reflective. The AR film can be composed of a dielectric film made of $MgF_2$ and TiON, for example. While both ends of the laser are AR films in this example, the end face film 17 may be composed of a reflecting film having a significant reflectance. When the semiconductors in contact with the end face film 17 in FIG. 2 are provided with a structure comprising a light-absorbing layer, the end face film. 17 having a significant reflectance can suppress optical output leaking out of the end face film 17. The significant reflectance is a reflectance of 10% or greater, for example. By the reflectance is meant herein the reflectance with respect to the inside of the semiconductor laser.

The diffraction gratings (corrugations) 18 are formed at a plurality of locations at predetermined intervals in the lower cladding layer 2 of the SG-DFB region A and CSG-DBR region B. This forms sampled gratings in the SG-DFB region A and CSG-DBR region B. A plurality of segments are provided in the lower cladding layer 2 in the SG-DFB region A and CSG-DBR region B. By the segment is meant herein a region in which a diffraction grating part provided with the diffraction grating 18 and a space part free of the diffraction gratings 18 continue with each other one by one. That is, the segment means a region in which a space part whose both ends are held by diffraction grating parts and the diffraction grating parts are connected to each other. The diffraction gratings 18 are composed of a material having a refractive index different from that of the lower cladding layer 2. When the lower cladding layer 2 is InP, $Ga_{0.22}In_{0.78}As_{0.47}P_{0.53}$ can be used as a material constituting the diffraction gratings, for example.

The diffraction gratings 18 can be formed by patterning using two-beam interference exposure. The space part located between the diffraction gratings 18 can be attained by exposing a pattern of the diffraction gratings 18 through a resist to light and then exposing the position corresponding to the space part to light again. The pitch of the diffraction gratings 18 in the SG-DFB region A may be identical to or different from that in the CSG-DBR region B. By way of example, both pitches are set identical to each other in this example. The diffraction gratings 18 may have the same length or different lengths in each segment. The diffraction gratings 18 in the SG-DFB region A may have the same length, the diffraction, gratings 18 in the CSG-DBR region B may have the same length, and these lengths may differ from each other.

The segments in the SG-DFB region A have substantially the same optical length. In the CSG-DBR region B, at least two segments are formed with the respective optical lengths different from each other. This causes the intensities at peaks of the wavelength characteristic of the CSG-DBR region B to depend on wavelength. The average optical length of segments in the SG-DFB region A differs from that in the CSG-DBR region B. Thus, the segments in the SG-DFB region A and the segments in the CSG-DBR region B construct a resonator in the semiconductor laser 30.

Reflected light beams interfere with each other within each of the SG-DFB region A and CSG-DBR region B. The SG-DFB region A is provided with the active layer 3 and generates a discrete spectrum having substantially the same peak intensity with predetermined wavelength intervals when a carrier is injected therein. On the other hand, the CSG-DBR region B generates a discrete reflection spectrum having different peak intensities with predetermined wavelength intervals. The peak wavelength intervals differ from each other in the respective wavelength characteristics in the SG-DFB region A and CSG-DBR region B. A wavelength satisfying an lasing condition can be selected by utilizing a vernier effect produced by the combination of the wavelength characteristics.

As illustrated in FIG. 1, the semiconductor laser 30 is arranged on a first temperature control device 31. The first temperature control device 31 includes a Peltier element and functions as a TEC (thermoelectric cooler). A first thermistor 32 is arranged on the first temperature control device 31. The first thermistor 32 detects the temperature of the first temperature control device 31. The temperature of the semiconductor laser 30 can be specified according to the temperature detected by the first thermistor 32.

The detection unit 50 is arranged on the front side of the semiconductor laser 30 in the wavelength tunable laser 100. Since the detection unit 50 functions as a wavelength locker unit, the wavelength tunable laser 100 can be referred to as front locker type. The detection unit 50 comprises a first light-receiving element 42, a beam splitter 51, an etalon 52, a second temperature control device 53, a second light-receiving element 54, and a second thermistor 55.

A beam splitter 41 is arranged at a position for splitting the output light from the front side of the semiconductor laser 30. The beam splitter 51 is arranged at a position for splitting light from the beam splitter 41. The first light-receiving element 42 is arranged at a position for receiving one of two light beams split by the beam splitter 51. The etalon 52 is arranged at a position for transmitting the other of the two light beams split by the beam splitter 51. The second light-receiving element 54 is arranged at a position for receiving the light transmitted through the etalon 52.

The etalon 52 has such a characteristic that its transmittance changes periodically according to the wavelength of light incident thereon. This example employs a solid etalon as the etalon 52. The periodical wavelength characteristic of the solid etalon changes with temperature. The etalon 52 is arranged at a position for transmitting the other of the two light beams split by the beam splitter 51. The etalon 52 is also arranged on the second temperature control device 53. The second temperature control device 53 includes a Peltier element and functions as a TEC (thermoelectric cooler).

The second light-receiving element 54 is arranged at a position for receiving the light transmitted through the etalon 52. The second thermistor 55 is provided in order to specify the temperature of the etalon 52. The second thermistor 55 is arranged on the second temperature control device 53, for example. In this example, the second thermistor 55 detects the temperature of the second temperature control device 53, thereby specifying the temperature of the etalon 52.

The memory 60 is a rewritable storage device. A typical example of the memory 60 is a flash memory. The controller 70 comprises a central processing unit (CPU), a RAM (Random Access Memory), a power supply, and the like. The RAM is a memory which temporarily stores programs executed by the central processing unit, data processed by the central processing unit, and the like.

The memory 60 stores initial set values of individual parts of the wavelength tunable laser 100 and feedback control target values in relation to channels. The channels are numbers corresponding to lasing wavelengths of the semiconductor laser 30. The wavelengths of channels are determined discretely within the wavelength tunable band of the wavelength tunable laser 100. For example, the channels correspond to grid wavelengths (at intervals of 50 (3 Hz) of the ITU-T (International Telecommunication Union Telecommunication Standardization Sector). Alternatively, the initial set values may be prepared at intervals narrower than those of the ITU-T grids. The wavelengths of channels are defined as fundamental wavelengths in this example.

Figure 3:
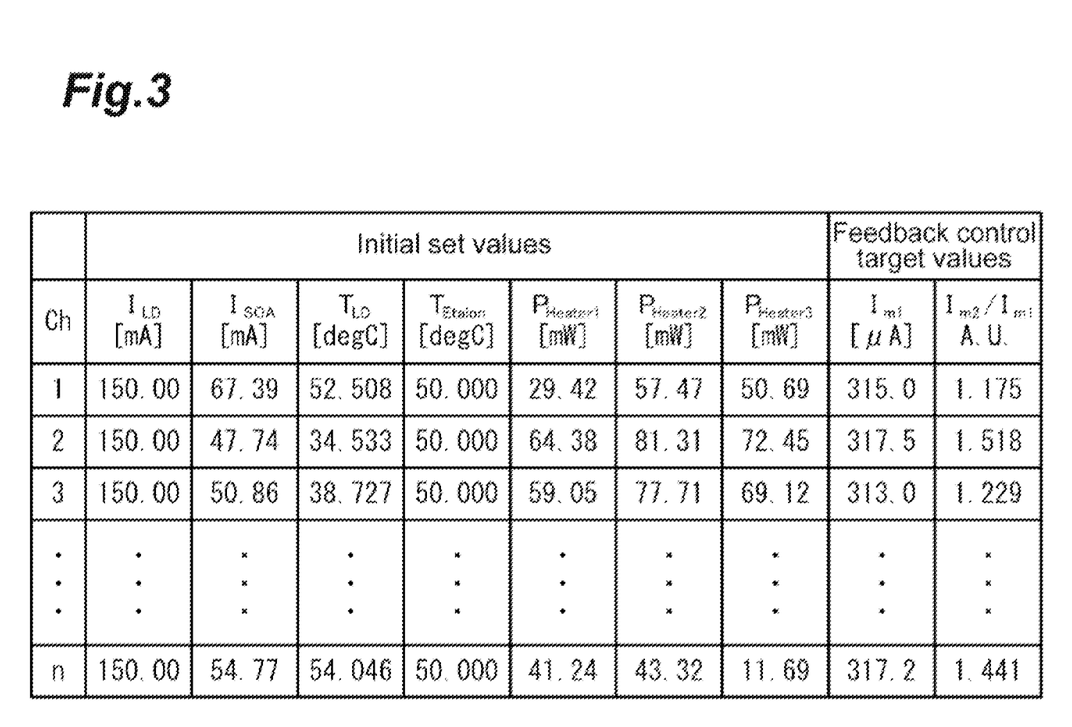
FIG. 3 is a table listing initial set values and feedback control target values.
Figure 4:
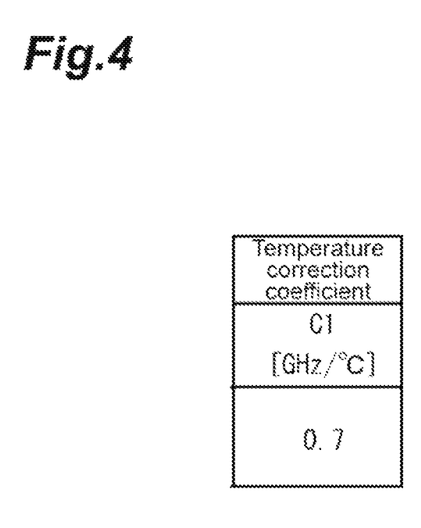
FIG. 4 is a chart illustrating a stored temperature correction coefficient C1.

FIG. 3 is a table listing the above-mentioned initial set values and feedback control target values. As listed in FIG. 3, the initial set values include an initial current value $I_{LD}$ supplied to the electrode 8 in the SG-DFB region A, an initial current value $I_{SOA}$ supplied to the electrode 21 of the SOA region C, an initial temperature value $T_{LD}$ of the semiconductor laser 30, an initial temperature value $T_{Etalon}$ of the etalon 52, and initial power values $P_{Heater1}$ to $P_{Heater3}$ supplied to the respective heaters 10. These initial set values are determined for each channel. The above-mentioned feedback control target values are target values for performing the feedback control of the controller 70. The feedback control target values include a target value $I_{m1}$ of a photocurrent outputted by the first light-receiving element 42 and a target value $I_{m2}/I_{m1}$ of the ratio of a photocurrent $I_{m2}$ outputted by the second light-receiving element 54 to the photocurrent $I_{m1}$ outputted by the first light-receiving element 42. The control target values are also determined for each channel. These values are acquired by tuning with a wavemeter for each wavelength tunable laser 100 before shipment. As illustrated in FIG. 4, the memory 60 also stores a temperature correction coefficient C1. The temperature correction coefficient C1 will be explained later in detail. The temperature correction coefficient C1 is a common value in the channels in this example.

Figure 5:
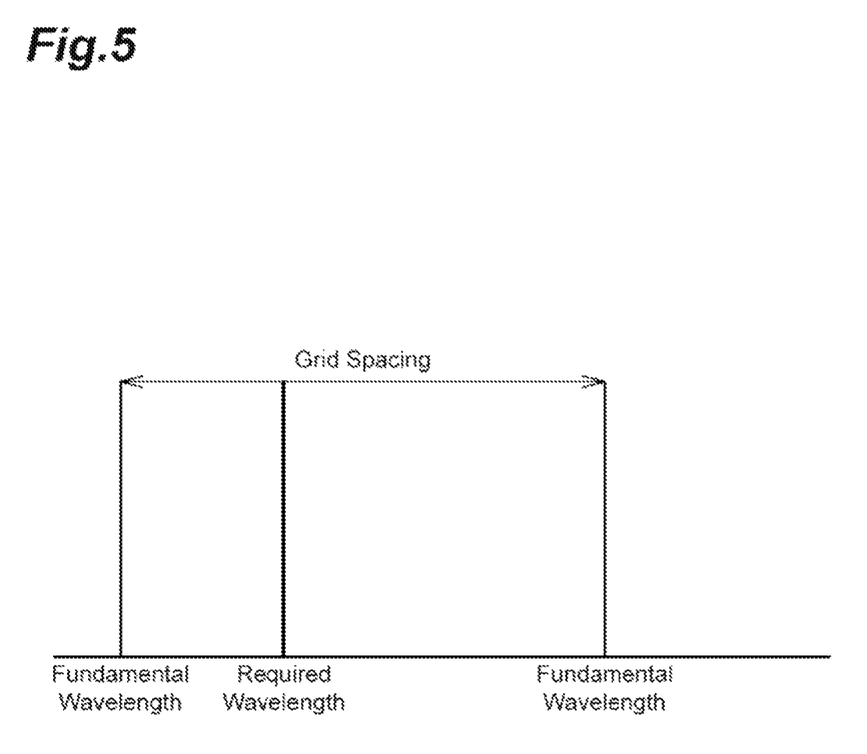
FIG. 5 is a chart illustrating a relationship between a required wavelength and fundamental wavelengths in gridless control.

The wavelength tunable laser 100 in accordance with this example can output a required wavelength not coinciding with the fundamental wavelengths. Control enabling output at a required wavelength different from the fundamental wavelengths will hereinafter be referred to as gridless control. FIG. 5 is a chart illustrating a relationship between a required wavelength and fundamental wavelengths in the gridless control. As illustrated in FIG. 5, the required wavelength is, in the gridless control, a wavelength between a fundamental wavelength and another fundamental wavelength adjacent thereto. However, the required wavelength may coincide with the fundamental wavelength.

Figure 6:
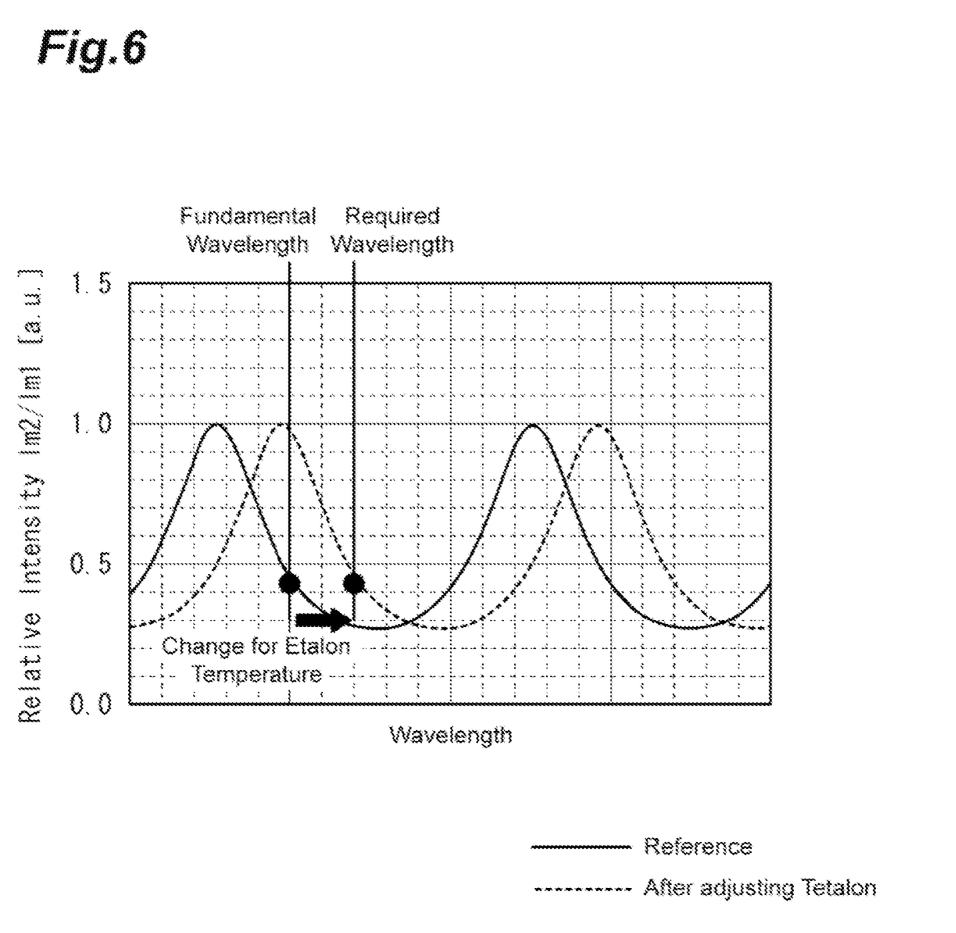
FIG. 6 is a chart illustrating a principle of the gridless control.

FIG. 6 is a chart illustrating a principle of the gridless control. In FIG. 6, the abscissa indicates wavelength, while the ordinate indicates normalized values of the ratio $I_{m2}/I_{m1}$ (transmittance of the etalon 52). In FIG. 6, a solid curve is a wavelength characteristic of the etalon 52 corresponding to the initial temperature value $T_{Etalon}$. The dotted curve is a wavelength characteristic of the etalon 52 when its temperature is raised by the second temperature control device 53. When the ratio $I_{m2}/I_{m1}$ at a black circle on the solid curve is employed as a feedback control target value here, lasing at a fundamental wavelength will occur if the etalon 52 is at the initial temperature value $T_{Etalon}$. If the etalon 52 is at a temperature corresponding to the wavelength characteristic indicated by the dotted curve, on the other hand, even when the ratio $I_{m2}/I_{m1}$ is at a value for attaining a fundamental wavelength (a black circle on the dotted curve), the actual lasing wavelength will shift from the fundamental wavelength by the change in the etalon characteristic. That is, shifting the etalon characteristic by the wavelength difference between the required wavelength and fundamental wavelength can attain the required wavelength, while the ratio $I_{m2}/I_{m1}$, which is the feedback control target value, is kept as it is. That is, the required wavelength can be attained by performing an arithmetic operation for changing the etalon temperature according to a wavelength difference $\Delta F$ between the required wavelength and fundamental wavelength and employing the result as the etalon temperature.

As mentioned above, the wavelength characteristic of the etalon 52 shifts with its temperature. The amount of change in frequency/amount of change in temperature [GHz/° C.] in the etalon 52 will be referred to as the temperature correction coefficient C1 of the etalon 52. Here, the wavelength is expressed in terms of frequency. The temperature correction coefficient C1 corresponds to the ratio of change in the drive condition of the wavelength tunable laser with respect to the change in wavelength.

Let Tetln_A [° C.] be a set temperature of the etalon 52 for achieving control for the required wavelength. Let Tetln_B [° C.] be the initial temperature of the etalon 52, i.e., the temperature of the etalon 52 corresponding to the selected fundamental wavelength. Tetln_B corresponds to $T_{Etalon}$ and is acquired from the memory 60. Let $\Delta F$ [GHz] be the wavelength difference (in absolute value) between the fundamental wavelength and required wavelength. The relationship among the parameters in this case can be represented by the following expression (1). The set temperature Tetln_A necessary for attaining the required wavelength can be determined according to the expression (1).

$$Tetln\_A = Tetln\_B + \Delta F/C1. \tag{1}$$

Controlling the temperature of the second temperature control device 53 at the set temperature Tetln_A makes it possible to attain the required wavelength while utilizing the ratio $I_{m2}/I_{m1}$ as it is. Executing the foregoing operations enables lasing of the semiconductor laser 30 at a wavelength (required wavelength) shifted from the fundamental wavelength by the shift in the characteristic of the etalon 52 as illustrated in FIG. 6.

A procedure of calculating a drive condition (updated set value) of the semiconductor laser 30 at the required wavelength will now be explained. By way of example, an actual value of wavelength or frequency is inputted as the required wavelength to the controller 70. For example, the required wavelength is inputted from an undepicted external I/O device to the controller 70. Typically, an I/O device conforming to the RS-232C standard is employed.

Figure 7A:
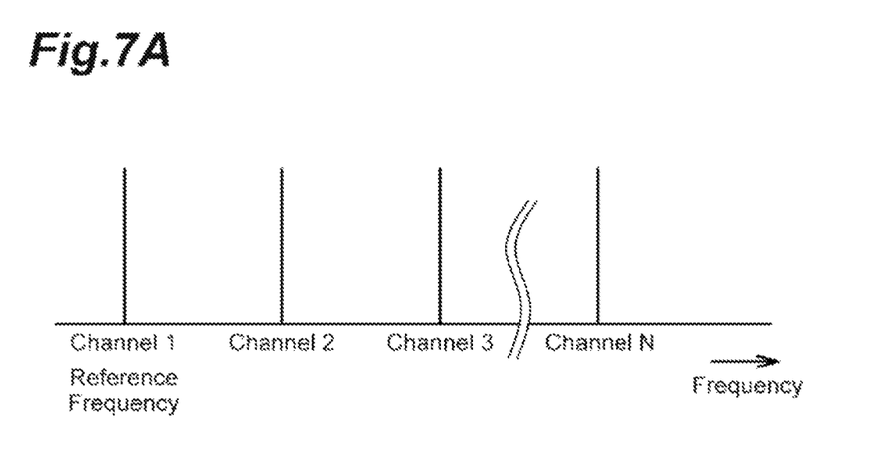
FIG. 7A is a chart illustrating frequencies corresponding to ITU-T grid wavelengths.
Figure 7B:
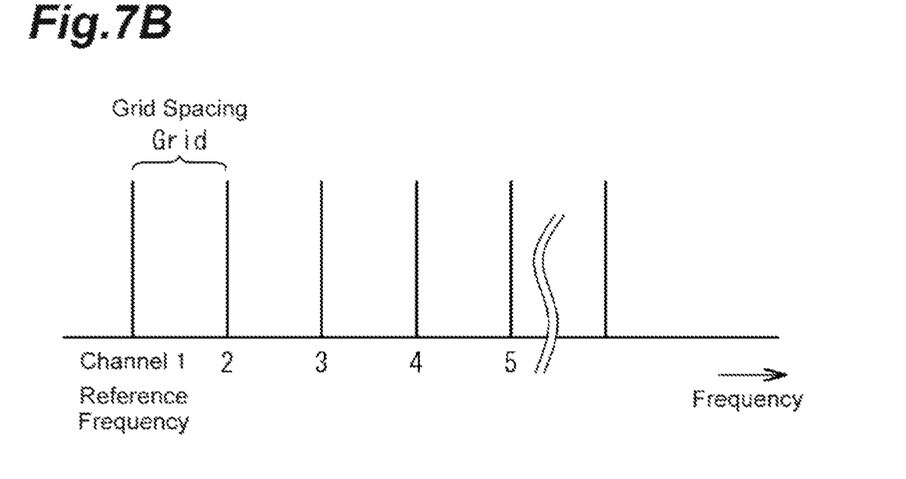
FIG. 7B is a chart illustrating frequencies corresponding to grid wavelengths different from the ITU-T grid wavelengths.

Alternatively, indirect information including at least two kinds of parameters may be inputted as the required wavelength. For example, a reference frequency (start grid wavelength), a channel number, and a grid spacing may be inputted. FIG. 7A is a chart illustrating frequencies corresponding to ITU-T grid wavelengths. FIG. 7B is a chart illustrating frequencies corresponding to grid wavelengths different from the ITU-T grid wavelengths. Since the grid spacing varies between FIGS. 7A and 7B, the channel frequencies in FIG. 7B do not coincide with those in FIG. 7A. Hence, the required wavelength differs from the fundamental wavelengths. However, there is a wavelength where the required wavelength and fundamental wavelength coincide with each other at the channel number of N.

For example, the lowest frequency in the grid wavelengths is set as a reference frequency. The channel number of this reference frequency is assumed to be 1. The frequency shifted from the reference frequency to the higher frequency side by a grid spacing is set as a grid wavelength at the channel number of 2. The channel numbers are similarly set up to the highest frequency. This reference frequency will hereinafter be referred to as reference frequency FCF (First Channel Frequency). The grid spacing will hereinafter be referred to as grid spacing Grid. The channel number will hereinafter be referred to as channel number CH.

The controller 70 calculates the required wavelength from the reference frequency FCF, grid spacing Grid, and channel number CH. Specifically, the frequency F can be determined according to the following expression (2), and the required wavelength can be calculated from the frequency F. Table 1 illustrates an example of the required wavelength (required frequency F) calculated by the following expression (2).

$$F=FCF+(CH-1)\times Grid. \qquad (2)$$

TABLE 1

| Wavelength required | |
|---|---|
| Reference frequency FCF | 191.0000 THz |
| Grid spacing Grid | 0.0001 THz |
| Channel number CH | 71 |
| Required frequency F | 191.0070 THz |

Next, the controller 70 selects a fundamental wavelength according to the required wavelength. For example, the controller 70 selects the fundamental wavelength closest to the required wavelength. For example, the controller 70 determines a difference between the required wavelength and the start grid wavelength, divides the difference by the grid wavelength spacing, and employs the integral part of the result as the channel number Ch. The controller 70 selects the fundamental wavelength corresponding to thus obtained channel number Ch. For example, it is acquired by adding the value obtained as the channel number Ch multiplied by the grid wavelength spacing to the start grid wavelength. Table 2 illustrates an example of the reference frequency FCF_M and Grid sparing Grid_M of fundamental wavelengths stored in the memory 60. Table 3 illustrates the fundamental wavelength selected under the conditions of Tables 1 and 2.

TABLE 2

| Information of fundamental wavelength in memory | |
|---|---|
| Reference frequency FCF_M | 191.0000 THz |
| Grid spacing Grid_M | 0.0025 THz |

TABLE 3

| Closest fundamental wavelength | |
|---|---|
| Channel number CH_M | 3 |
| Fundamental wavelength F_M | 191.0075 THz |

Next, the controller 70 calculates an updated set value according to the wavelength difference $\Delta F$. First, using the etalon temperature Tetln_B stored as an initial set value and the wavelength difference $\Delta F$, the controller 70 calculates the set temperature Tetln_A according to the above-mentioned expression (1). The controller 70 also computes a set value of the semiconductor laser 30 for achieving the required wavelength of the gridless control. For example, the controller 70 refers to an undepicted correction coefficient from the memory 60 and computes the set value from the initial current value $I_{LD}$, initial temperature value $T_{LD}$, initial power values $P_{Heater1}$ to $P_{Heater3}$, and wavelength difference $\Delta F$. Subsequently, the controller 70 writes the set temperature Tetln_A of the etalon 52 and the set value of the semiconductor 30 as updated set values into its own RAM and drives the semiconductor laser 30 while using thus written updated set values as drive conditions.

A case where the required wavelength, coincides with any fundamental wavelength will be studied here. If the wavelength difference $\Delta F$ is calculated, and an updated set value is calculated by using the wavelength difference $\Delta F$ in this case, the resulting updated set value will be identical to the initial set value of the fundamental wavelength. Therefore, the procedure of calculating the updated set value is unnecessary processing. This is illustrated in the flowchart of FIG. 8, for example.

Figure 8:
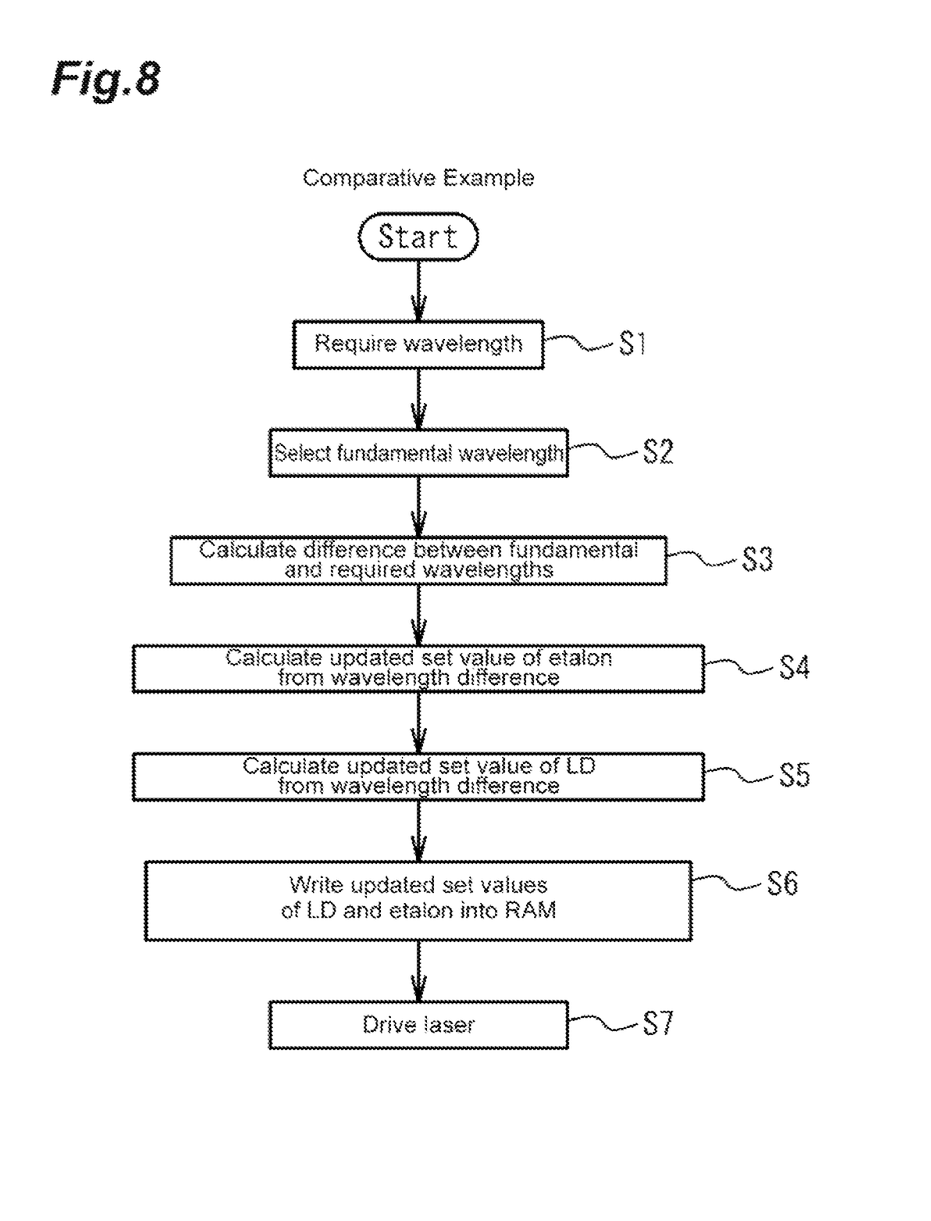
FIG. 8 is a flowchart illustrating a procedure of calculating an updated set value (a comparative example)

As illustrated in FIG. 8, the controller 70 receives an input of a required wavelength (step S1). When thus inputted information is indirect information, the controller 70 calculates the required wavelength according to the above-mentioned expression (2) and the like. Subsequently, the controller 70 selects a fundamental wavelength according to the required wavelength (step S2). Then, the controller 70 calculates the difference between the fundamental wavelength and required wavelength as the wavelength difference $\Delta F$ (step S3). Thereafter, the controller 70 reads the initial set value and feedback control target value concerning the fundamental wavelength selected at the step S2 from the memory 60 and calculates the set temperature Tetln_A of the etalon 52 as an updated set value by using the wavelength difference $\Delta F$ (step S4). Next, the controller 70 calculates an updated set value of the semiconductor laser 30 by using the wavelength difference $\Delta F$ (step S5). Subsequently, the controller 70 writes the updated set value of the etalon 52 and the updated set value of the semiconductor laser 30 into its own RAM (step S6). Then, the controller 70 drives the semiconductor laser 30 while using the updated set values written into the RAM as drive conditions (step S7). According to this flowchart, the processing for calculating the updated set values is executed even when the required wavelength coincides with the fundamental wavelength.

Figure 9:
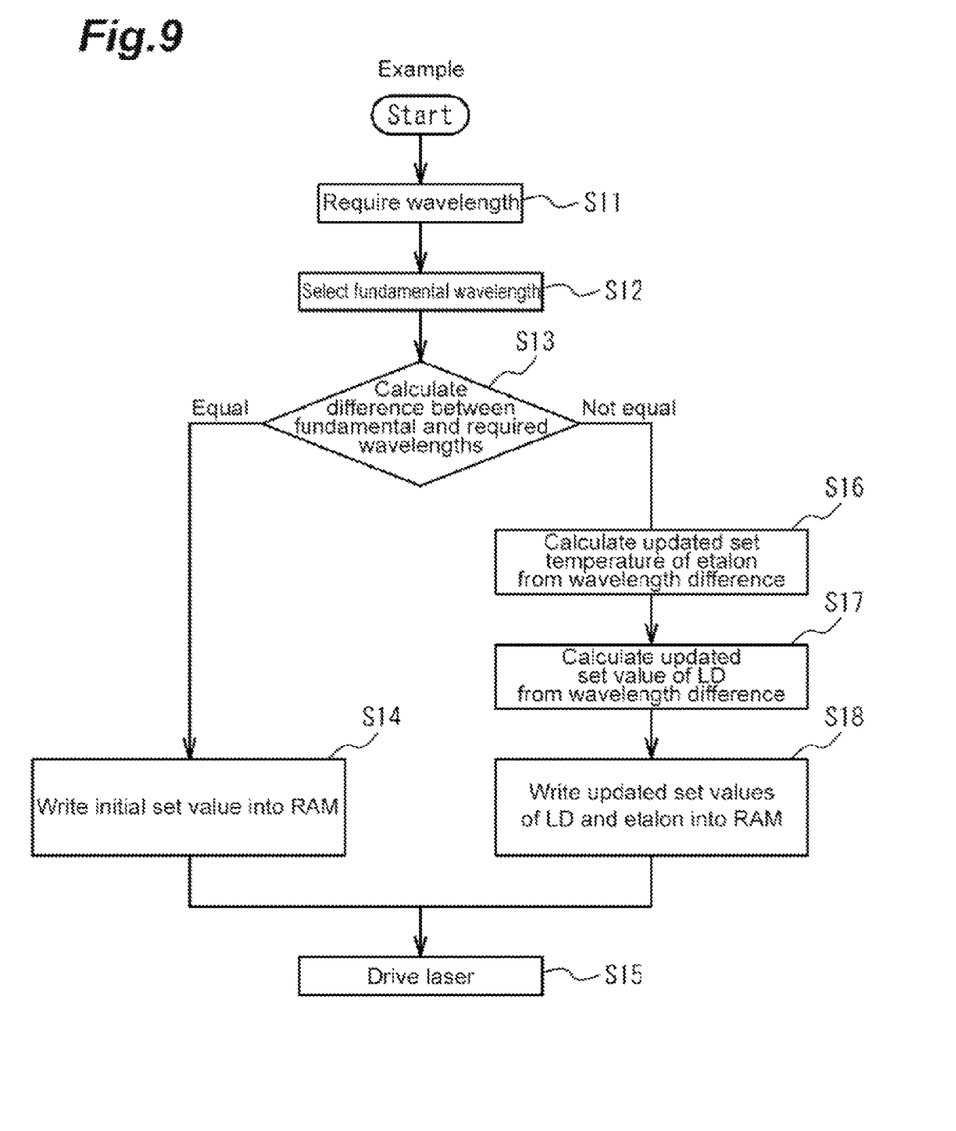
FIG. 9 is a flowchart illustrating a procedure of calculating an updated set value (an example)

Therefore, this example omits the procedure of calculating the updated set values when the required wavelength coincides with the fundamental wavelength. FIG. 9 is an example of flowcharts in this case. As illustrated in FIG. 9, the controller 70 receives an input of a required wavelength (step S11). When thus inputted information is indirect information, the controller 70 calculates the required wavelength according to the above-mentioned expression (2) and the like. Subsequently, the controller 70 selects a fundamental wavelength according to the required wavelength (step S12). Then, the controller 70 calculates the difference between the fundamental wavelength and required wavelength as the wavelength difference $\Delta F$ (step S13). Next, when $\Delta F$ is zero, the controller 70 writes the initial set value of the fundamental wavelength selected at the step S12 into the RAM (step S14). Thereafter, the controller 70 drives the semiconductor laser 30 while using the initial set value written into the RAM (step S15). The SOA region C is controlled so that no light is outputted from the semiconductor laser 30 at this point of time. Unless $\Delta F$ is zero at the step S13, the controller 70 performs processing similar to that of the steps S4 to S6 in FIG. 8 as steps S16 to S18, so as to write updated set values into the RAM, and then executes step S15.

At the step S13, a wavelength index table (not depicted) using wavelength values as an index and storing data linked with the channel number of the memory 60 is referred to; when a wavelength identical to the required wavelength exists in the wavelength index table, the channel number is obtained from the linked data, and the set value of the required wavelength is acquired from the memory 60. This makes it possible to acquire the set value of the required wavelength from the memory 60 even when the channel number that is wavelength information in which the grid spacing is not fixed is stored in the memory.

This example omits to calculate updated set values when the required wavelength coincides with the fundamental wavelength. This prevents unnecessary processing from occurring.

Figure 10:
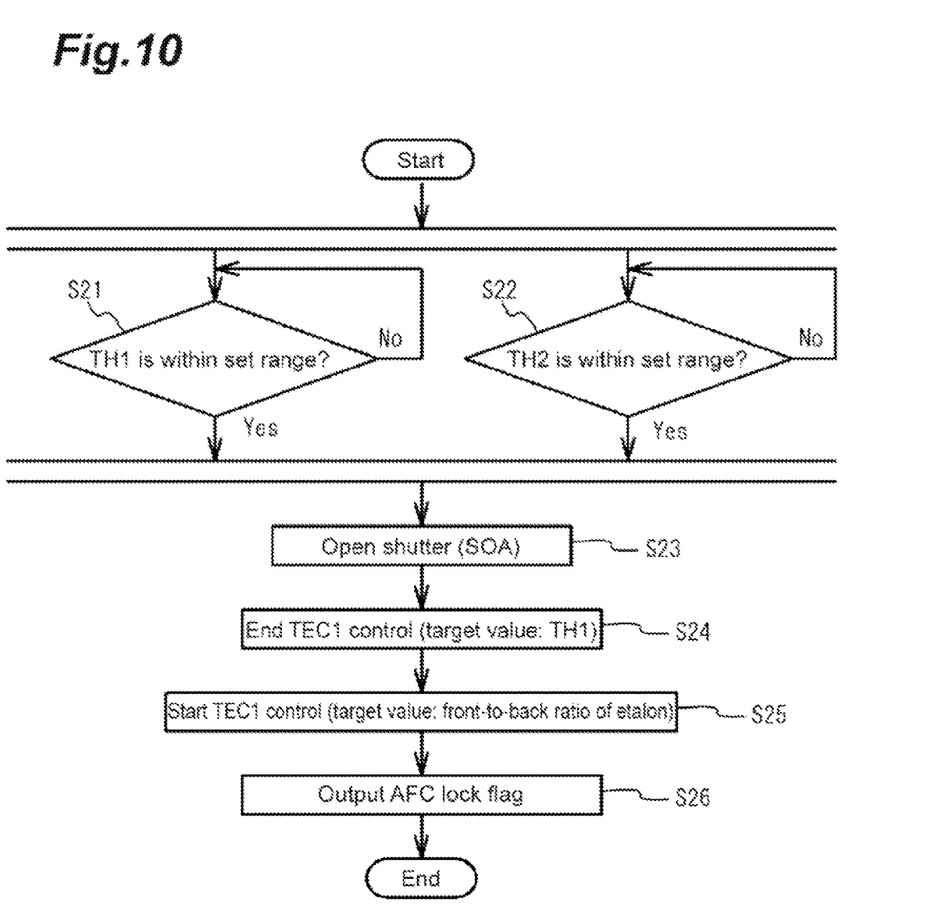
FIG. 10 is a flowchart illustrating an example of control after driving the semiconductor laser.

FIG. 10 is a flowchart illustrating an example of control after driving the semiconductor laser 30. As illustrated in FIG. 10, the controller 70 determines whether or not a detected temperature TH1 of the first thermistor 32 falls within a range of $T_{LD}$ (step S21). Here, the range of $T_{LD}$ is a predetermined range centered at the temperature value $T_{LD}$ in the drive conditions. When it is determined "No" at the step S21, the controller 70 changes the current value supplied to the first temperature control device 31 so that the detected temperature TH1 of the first thermistor 32 approaches the temperature value $T_{LD}$.

In parallel with the step S21, the controller 70 determines whether or not a detected temperature TH2 of the second thermistor 55 falls within a set range (step S22). The set range in this case is determined according to the set temperature of the etalon 52 included in the drive conditions. The set range can be a predetermined range centered at the set temperature of the etalon 52, for example. When it is determined "No" at the step S22, the controller 70 changes the current value supplied to the second temperature control device 53 so that the detected temperature TH2 of the second thermistor 55 approaches the set temperature of the etalon 52.

The controller 70 waits until it is determined "Yes" at both of the steps S21 and S22. When it is determined. "Yes" at both of the steps S21 and S22, the controller 70 acts to open a shutter (step S23). Specifically, the current supplied to the electrode 21 of the SOA region C is controlled so as to become the initial current value $I_{SOA}$. This causes the semiconductor laser 30 to output laser light having a wavelength based on the drive conditions. Though not depicted, the controller 70 performs auto power control (APC) for feedback control of optical output in the SOA region. Specifically, as the auto power control, the controller 70 feedback-controls the current $I_{SOA}$ supplied to the electrode 21 of the SOA region C so that the photocurrent value outputted from the first light-receiving element 42 becomes the target value $I_{m1}$ corresponding to the channel. As a consequence, the output light intensity of the semiconductor laser 30 is controlled so as to become a desirable value.

Next, the controller 70 terminates the temperature control targeted at the temperature value $T_{LD}$ by the first temperature control device 31 (step S24). Subsequently, the controller 70 starts AFC control by the first temperature control device 31 (step S25). That is, the temperature of the first temperature control device 3115 feedback-controlled so as to satisfy the ratio $I_{m2}/I_{m1}$ of the feedback control target value. The ratio between the input light and output light of the etalon 52 (front-to-back ratio) indicates the lasing wavelength of the semiconductor laser 30. The first temperature control device 31 is a parameter for controlling the wavelength of the semiconductor laser 30. That is, the step S21 controls the wavelength of the semiconductor laser 30 by feedback-controlling the temperature of the first temperature control device 31 such that the front-to-back ratio becomes the $I_{m2}/I_{m1}$. This achieves the required wavelength. When the ratio $I_{m2}/I_{m1}$ is seen to fall within a predetermined range centered at the target value $I_{m2}/I_{m1}$ at the fundamental wavelength selected at the step S2, the controller 70 outputs an AFC lock flag (step S26). Thereafter, the execution of the flowchart ends.

What is claimed is:

1. A method for controlling a wavelength tunable laser, comprising steps of:
   setting a first wavelength at which the wavelength tunable laser lases;
   determining a target drive condition
      when the first wavelength matches with a second wavelength, by a drive condition corresponding to the second wavelength, and
      when the first wavelength is offset from the second wavelength, by a calculation from a difference between the first wavelength and the second wavelength and the drive condition corresponding to the second wavelength; and
   controlling a lasing wavelength by the target drive condition
   wherein the wavelength tunable laser provides a wavelength detection unit including an etalon, and the drive condition for determining the target drive condition includes a target value output from the wavelength detection unit and a temperature of the etalon at the second wavelength;
   wherein the step of determining the target drive condition includes a step to calculate the temperature of the etalon at the second wavelength;
   wherein the wavelength tunable laser includes a thermoelectric cooler (TEC); and
   wherein the step of controlling the lasing wavelength includes a step to control the TEC such that the etalon shows the target value in a front-to-back ratio thereof.

2. The method of claim 1,
   wherein the wavelength detection unit includes a first light-receiving element for detecting light incident on the etalon and a second light-receiving element for detecting light emitted from the etalon; and
   wherein the wavelength tunable laser performs an auto power control (APC) based on an output of the first light-receiving element.

3. The method of claim 2,
   wherein the wavelength tunable laser includes a semiconductor optical amplifier; and
   wherein the step of controlling the lasing wavelength includes a step of feeding a control signal determined by the APC to an electrode of the optical semiconductor amplifier.

4. The method of claim 1,
   wherein the wavelength tunable laser further includes a controller, and
   wherein the step of controlling the lasing wavelength further includes a step of outputting a wavelength lock flag by the controller when the front-to-back ratio of the etalon enters within a predetermined range around the target value.

5. The method of claim 1,
   wherein the step of controlling the lasing wavelength includes a step to control the TEC such that the temperature of the TEC enters within a preset temperature range around the wavelength tunable laser, and
   wherein, when the temperature of the TEC enters within the preset temperature range around the wavelength tunable laser, the TEC is terminated in entering within the preset temperature range around the wavelength tunable laser, and feedback control of the TEC is started so that the front-to-back ratio of the etalon attains the target value.

6. The method of claim 1,
wherein the etalon is mounted on another TEC different from the TEC, and the another TEC is controlled so that the temperature of the etalon enters within a predetermined range around the target value.

7. The method of claim 1,
wherein the first wavelength is specified at least two of a wavelength or a frequency corresponding to the second wavelength that is at least one of a wavelength grid following an ITU-T standard, a grid spacing of the wavelength grid, and a channel number of the wavelength grid.

8. The method of claim 1,
wherein the step of controlling the lasing wavelength includes a step to control the second wavelength is any of the wavelengths of ITU-T grids.

9. The method of claim 1,
further the step of controlling the lasing wavelength includes a step to store information in a memory, the information specifying the second wavelength as a wavelength value, and the target drive condition corresponding to the second wavelength;
wherein the step of controlling the lasing wavelength includes a step to control the information specifying the second wavelength as the wavelength value, and the target drive condition at the second wavelength in the memory.

10. The method of claim 1, further comprising:
comparing the first wavelength with the second wavelength that corresponds to one among a plurality of predefined wavelengths, wherein the step of determining is based on the step of comparing.

11. The method of claim 10, wherein the second wavelength corresponds to a wavelength that is closest to the first wavelength among the plurality of predefined wavelengths.

\* \* \* \* \*